United States Patent [19]
Fehr

[11] Patent Number: 6,058,602
[45] Date of Patent: May 9, 2000

[54] METHOD FOR ENCAPSULATING IC PACKAGES WITH DIAMOND SUBSTRATE

[75] Inventor: Gerald K. Fehr, Cupertino, Calif.

[73] Assignee: Integrated Packaging Assembly Corporation, San Jose, Calif.

[21] Appl. No.: 09/157,750

[22] Filed: Sep. 21, 1998

[51] Int. Cl.[7] .................................................. H01R 43/00
[52] U.S. Cl. ........................... 29/827; 174/52.2; 257/675
[58] Field of Search ............................. 29/827, 830, 852; 257/675, 677; 174/52.2

[56] References Cited

U.S. PATENT DOCUMENTS

| | | |
|---|---|---|
| 5,122,858 | 6/1992 | Mahulikar et al. . |
| 5,205,288 | 4/1993 | Doering et al. ............................. 29/827 |
| 5,367,196 | 11/1994 | Mahulikar et al. . |
| 5,378,924 | 1/1995 | Liang . |
| 5,608,267 | 3/1997 | Mahulikar et al. . |
| 5,905,299 | 5/1999 | Lacap . |
| 5,942,234 | 8/1995 | Liang . |

OTHER PUBLICATIONS

Davidson, H.L et al Proc. 45th Electronic Components and Tech. Conf. pp. 538–41, 1995.

Burgess et al ISHM '92 Proc. of the '92 Intr. Symposium on Microelectronics pp. 106–111, 1992.

Petkie et al, Proc. 4th Intr Symposium of Advanced Packaging Materials Process, Properties and Interfaces, 1998.

*Primary Examiner*—Carl J. Arbes
*Attorney, Agent, or Firm*—Donald R. Boys; Central Coast Patent Agency

[57] ABSTRACT

A method for manufacturing a plastic encapsulated integrated circuit (IC) package has steps for placing a diamond substrate in a lower cavity of an encapsulation mold such that the diamond substrate in the finished package underlies the die attach pad and a portion of the leads in close proximity to each. Pins are provided in lower cavities of molds to support and/or position diamond substrates to lie close to both die attach pads and leads to facilitate efficient heat transfer from an operating IC, through the die attach pad, into and through the diamond substrate, and finally to the leads leading from the encapsulated package. Apparatus is disclosed for positioning and supporting diamond substrates, and combination heat slugs for the purpose are disclosed, having diamond substrates bonded to metal slugs.

6 Claims, 17 Drawing Sheets

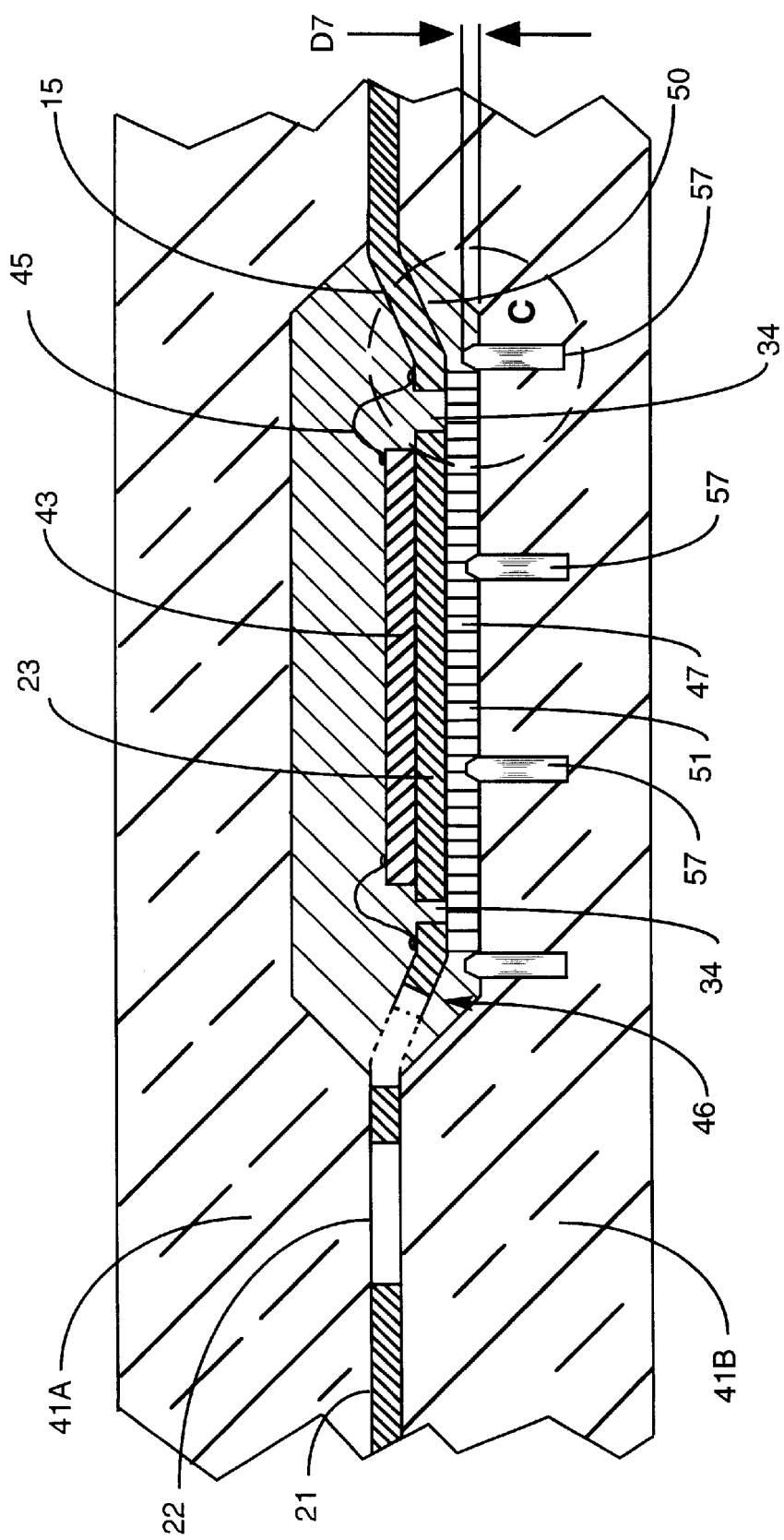

METHOD FOR ENCAPSULATING IC PACKAGES WITH DIAMOND SUBSTRATE

FIELD OF INVENTION

The present invention is in the area of integrated circuit (IC) manufacturing, and pertains in particular to apparatus and methods for encapsulating ICs with diamond substrates to conduct heat away from an operating IC in encapsulated IC packages.

BACKGROUND OF THE INVENTION

In current art, integrated circuits (ICs) are building blocks for most electronic circuitry. IC technology has grown from single transistor devices to having more than a million circuits in a single IC. Similarly, operating frequencies of microcircuits have grown to 100 megahertz and more. This growth in IC density and speed has benefitted users through development of increasingly smaller, faster, more capable, and more portable electronic devices.

The increased capability, however, comes with an inherent disadvantage in the form of heat. ICs, like most other electrical devices, consume electrical power and dissipate much of the power as heat Higher circuit densities and higher operating speeds cause a microcircuit to consume greater amounts of power and dissipate greater amounts of heat. It is not uncommon, in current art, for an IC to consume and dissipate 30 to 50 watts.

An inherent disadvantage in current IC technology is that electrical properties of silicon devices change appreciably with temperature changes. IC's function correctly only up to about 200 degrees Celsius (C.) which can be generated by dissipation of about I watt of power at room temperature (Integrated Circuit Design and Technology, pg. 51, M. J. Morant, Chapman and Hall, London, 1990). Temperatures over 200 degrees C. can cause an IC to become unstable in its current carrying capability and reduce its reliability and circuit life. IC's are typically packaged in an air-tight environment, such as a plastic-polymer encapsulation, to provide a physically stable environment and to protect sensitive and fragile components.

An inherent disadvantage of plastic-polymer encapsulation of an IC is that it typically decreases an IC's ability to dissipate heat. Because of this disadvantage, methods have been devised to conduct heat away from ICs in encapsulated packages to keep the ICs operating below their maximum stable operating temperatures.

One method known in current art is to replace the die attach pad of a lead frame with a chemically vapor deposited (CVD) diamond substrate, such that the diamond substrate bridges the gap between the IC and the leads in a package. Diamond has a very high thermal conductivity, has outstanding electrical resistivity, and is readily available and cost effective for many applications.

Conventional apparatus and methods for placing diamond substrates in IC packages for heat dissipation is best explained by first describing conventional IC encapsulation apparatus and method. In general, a conventional plastic encapsulation apparatus and method to form IC packages with conductive leads, without a diamond thermal conductor, is as follows: Typically, ICs in die form, also referred in the art as IC die, are attached to mounting areas called islands, or die-attach pads, on metal strips known in the art as lead frames. In this specification, die-attach pad terminology will be used.

Lead frame strips are made of a thin, electrically conductive material and typically have several individual frames with die-attach pads. Each die-attach pad supports an individual IC die during a molding operation. In an IC packaging molding operation, individual dies are encapsulated in a plastic-polymer material, leaving conductive leads protruding from the finished plastic package.

In many cases, densely packaged ICs are manufactured to maximize connectivity by utilizing all four sides of an IC die for connections off-chip. Around the perimeter of each die-attach pad in a lead frame for such die, the frame has a pattern of individual conductive leads for providing electrical connection from wire-bonding pads on the die to outside the package to be formed. The die attach pads and individual leads are formed by selective removal of material in the lead frame, such as by stamping. The number of the leads at a frame with a single die attach pad depends directly on the configuration of a particular IC die to be mounted.

A typical IC die may have over as many as 200 or more external terminations in current art, and each lead frame will have a corresponding number of individual conductive leads. The width of each conductive lead, and separation between adjacent leads, is dependent, among other things, on the size of a finished IC package. The thickness of each conductive lead is the thickness of the lead frame and is predicated on the electrical requirements of the packaged IC during normal operation.

An IC package with external leads for connecting to, for example, a printed circuit board, is typically formed by a plastic-polymer encapsulation process. After IC dies are mounter to die attach pads and thin wires are bonded from each termination pad on the die to the corresponding lead of the lead frame, the lead frame is placed between mating portions of an encapsulation mold, the mold halves are closed, and a liquid-phase polymer is injected to encapsulate IC dies attached to die-attach pads in each frame.

To stop flow of liquid-phase polymer between leads, a lead frame has a pattern of dam bars between individual leads, so a contiguous band of material is formed around the periphery of a die-attach pad. This contiguous dam bar band stops polymer flow, and shapes the outer periphery of an individual package.

After the liquid-phase polymer solidifies and the mold portions are opened, a trimming operation in manufacturing process removes excess plastic in the region around the mold outline and the dam bars as well, leaving the individual leads electrically isolated from one another, and the only thermally conductive path from the IC chip to outside the package other than through the polymer package, is through small wires bonded between the leads and corresponding termination pads on the IC die.

The trimming process is often termed de-junking in the art. The dam bar is removed between each lead, providing electronic integrity for each lead. De-damming is a process of removing all or part of each dam bar by use of a punch with a pattern of teeth conforming to the pattern of dam bars in a lead frame. Typically- de-damming and de-junking can be done in a single step.

In following processing, each lead exposed from the edge of a plastic package may be further treated, such as by cleaning and plating, and the individual IC packages are trimmed from the lead frame strip. Finally, the leads are formed for connectivity to external circuits, such as for Surface Mount Technology (SIT) applications.

In state-of-art manufacturing automated machines are used to perform the encapsulation process. Automated machines are marketed by a number of manufacturers, including several Japanese manufacturers. Such automated machines include molds made to close over one or more lead frames, as described above, whereinafter an encapsulation material, such as liquid-phase polymer, is injected and caused to solidify.

A known apparatus and method for using a CVD diamond substrate in an IC package to conduct heat away from an IC die, adds several steps to the apparatus and methods described above for encapsulating IC packages without a CVD diamond substrate. In general, in this known process, the die attach pads of existing lead frames are entirely removed, or lead frames are produced without die attach pads. Then a diamond substrate is bonded to the leads in place of the die attach pad, and, in effect becomes a new die attach pad.

The diamond substrate in this known process is firmly bonded to the leads, and IC dies are firmly bonded directly to the diamond substrate die attach pad.

After construction of this new lead frame with a diamond substrate die attach pad firmly bonded to the leads, IC dies are bonded to the diamond die attach pads Oust as in the previously described process dies are bonded to the metal die attach pads) and the new lead frames with dies attached are substituted in the process already described above for IC packaging without a diamond substrate.

Adding, the CVD diamond substrate by replacing the die attach pads in a lead frame entails several new steps in the encapsulation process already described: First, the die attach pad is cut away, a CVD diamond substrate is placed and carefully aligned with the leads, then a mounting operation is performed including curing an adhesive. These extra steps add time and cost to the IC packaging process.

What is clearly needed is an apparatus and method that allows a diamond substrate to be placed in an IC package, using existing manufacturing equipment and processes, without taking extra steps to produce new lead frames or alter existing lead frames to remove die attach pads and to bond diamond substrates to leads of the new lead frame.

SUMMARY OF THE INVENTION

In a preferred embodiment, a plastic encapsulated integrated circuit (IC) package is provided, comprising a metal die attach pad: an IC chip bonded to the metal die attach pad; metal leads extending from the package and joined by wires to contact pads on the IC chip; and a diamond substrate. The diamond substrate underlies and is adjacent to, but not bonded to the die attach pad and also underlies and is adjacent to, but not bonded to, a plurality of the metal leads within the plastic encapsulation.

Packages according to the invention are provided for dual in-line package (DIP) designs and for quad flat package (QFP) designs, and for other form factors as well. In some embodiments diamond substrates are bonded to metal slugs, forming combination heat slugs, which may have support appendages from the metal slug.

Methods for practicing the invention are disclosed as well, and a combination heat slug is provided in several forms according to various embodiments of the invention.

BRIEF DESCRIPTION OF THE DRAWINGS

FIG. 7A is a cross section of an IC encapsulation mold set closed on a conventional lead frame, with an IC die and diamond substrate according to yet another alternative embodiment of the present invention.

DESCRIPTION OF PREFERRED EMBODIMENTS

Figure 1:
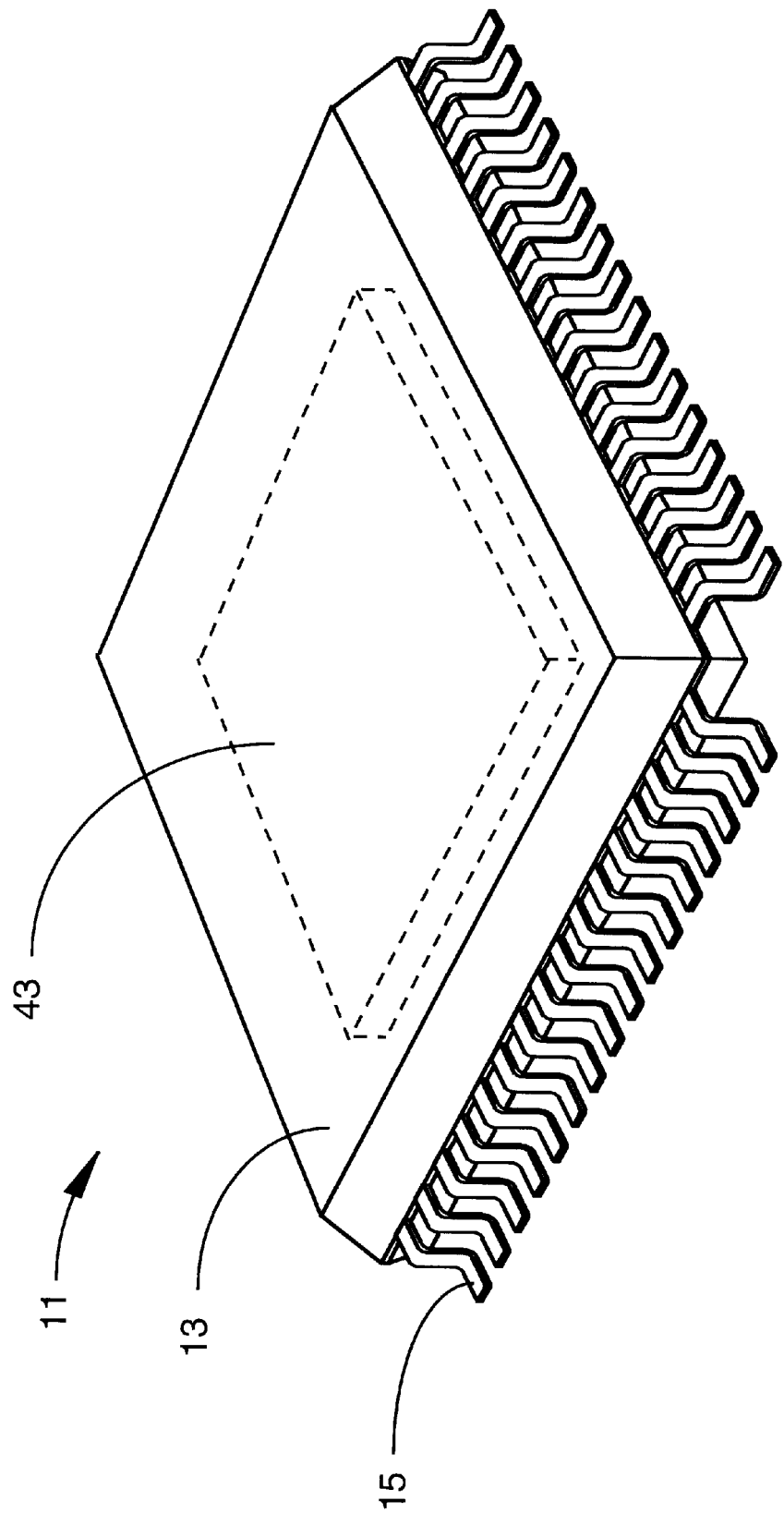
FIG. 1 is an idealized isometric view of a conventional quad flat pack (QFP) IC package.

FIG. 1 is an isometric view of a conventional quad flat pack (QFP) IC package 11. Typically, body 13 of IC package 11 is formed of plastic material by a method of transfer molding. IC die 43 is inside, and completely encapsulated by the plastic molded body. The molded package protects sensitive and fragile circuitry on the IC die, and fixes the arrangement of individual conductive leads.

A die contains circuitry that defines electrical functions of a particular IC, and circuitry of an IC die is connected so an outside environment through individual conductive leads 15. Conductive leads are typically made from a material that has good electrical conductivity that is also receptive to bending and forming while maintaining structural integrity. Conductive leads, as shown by this example, may be formed into J-bends for surface mount technology (SMT) application.

QFPs are common in the art, but are by no means the only form of package used. There are several other standard package designs. QFPs are used, however, in the present specification as a good example to illustrate the present invention.

Figure 2:
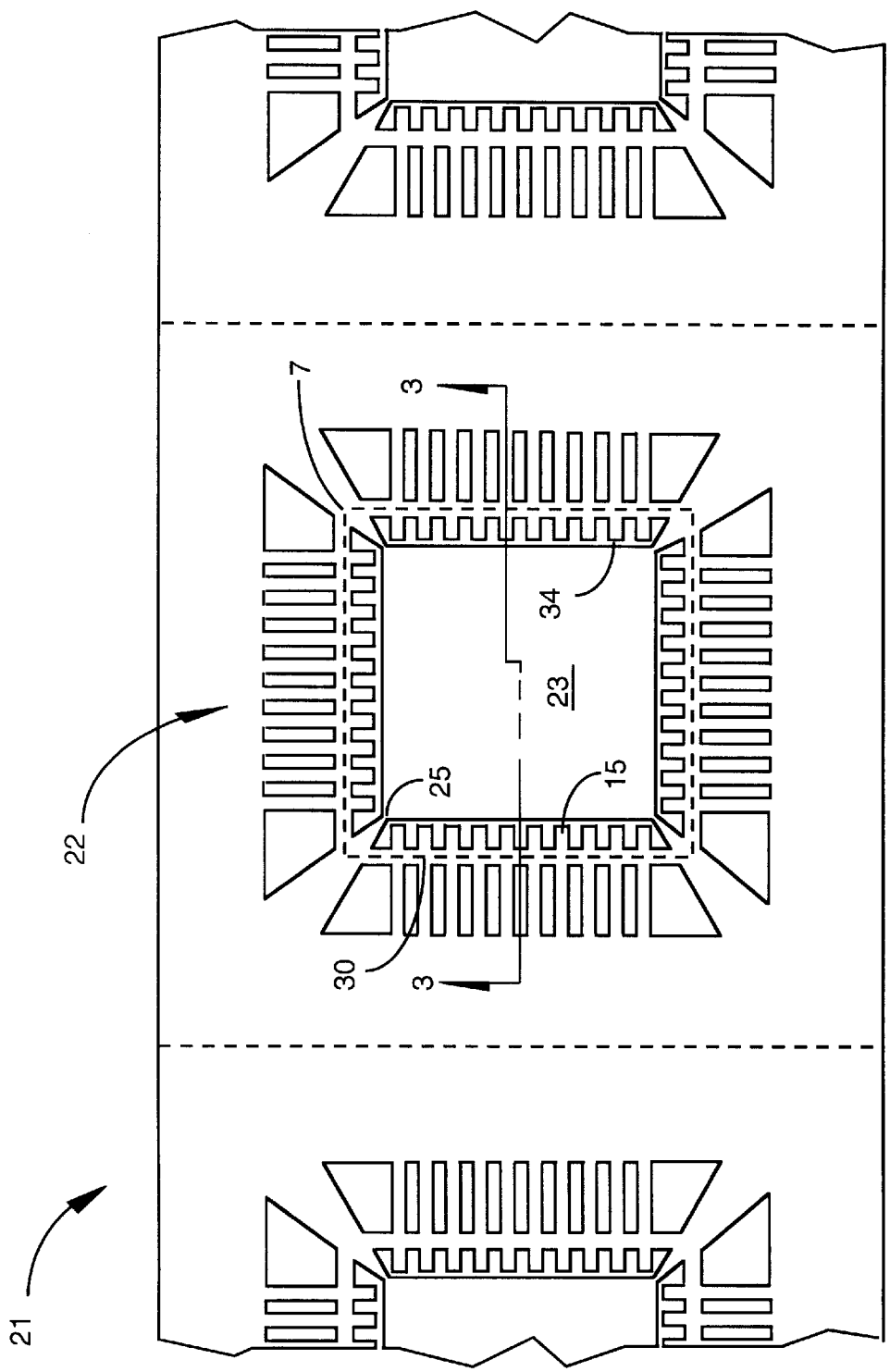
FIG. 2 is an idealized plan view of a portion of a conventional lead frame.

FIG. 2 is an idealized plan view of one frame 22 of a typical prior art lead frame strip 21 before a process of attaching a die and encapsulation. Lead strip 21 comprises several lead frames identical to lead frame 22, whereon individual IC packages are constructed. The layout of FIG. 2 is intentionally simplified to illustrate the principles involved.

As is well-known in art, different lead frames for differently-designed dies typically have a different number of die attach pads in a strip. Lead frames are made of a conductive material, typically a malleable metal material, and formed in thin sheets. Sheet thickness of lead frame 21 provides a thickness of resulting conductive leads from a finished IC package.

In the example of frame 22, a plurality of leads 15 are provided approaching, but not contacting, a die attach pad 23. A gap 34 at each lead serves to electrically isolate die attach pad 23 from each lead. Die attach pad 23 is supported in this example by regions 25 at the corners.

Frame 22 defines outer edges of a subsequent plastic encapsulation by means of dam bars 30 between conductive leads 15. These dam bars. stop the flow of liquid-phase polymer during a encapsulation process. Their placement between leads provides a contiguous strip of material around each island, illustrated by broken line 7.

The necessity for dam bars 30 means that, at this stage, all conductive leads 15 surrounding die attach pad 23 are electrically connected to one another, and to the die attach pad by regions 25 at the corners. The dam bars are subsequently removed after encapsulation by trimming punches in a separate process. The later removal of the dam bars provides electrical isolation from each lead to others.

In a conventional die attach process, individual IC dies are affixed to each die attach pad, substantially centered, and aligned so the four edges of a QFP at each frame are parallel to edges of the corresponding die-attach pad.

Figure 3:
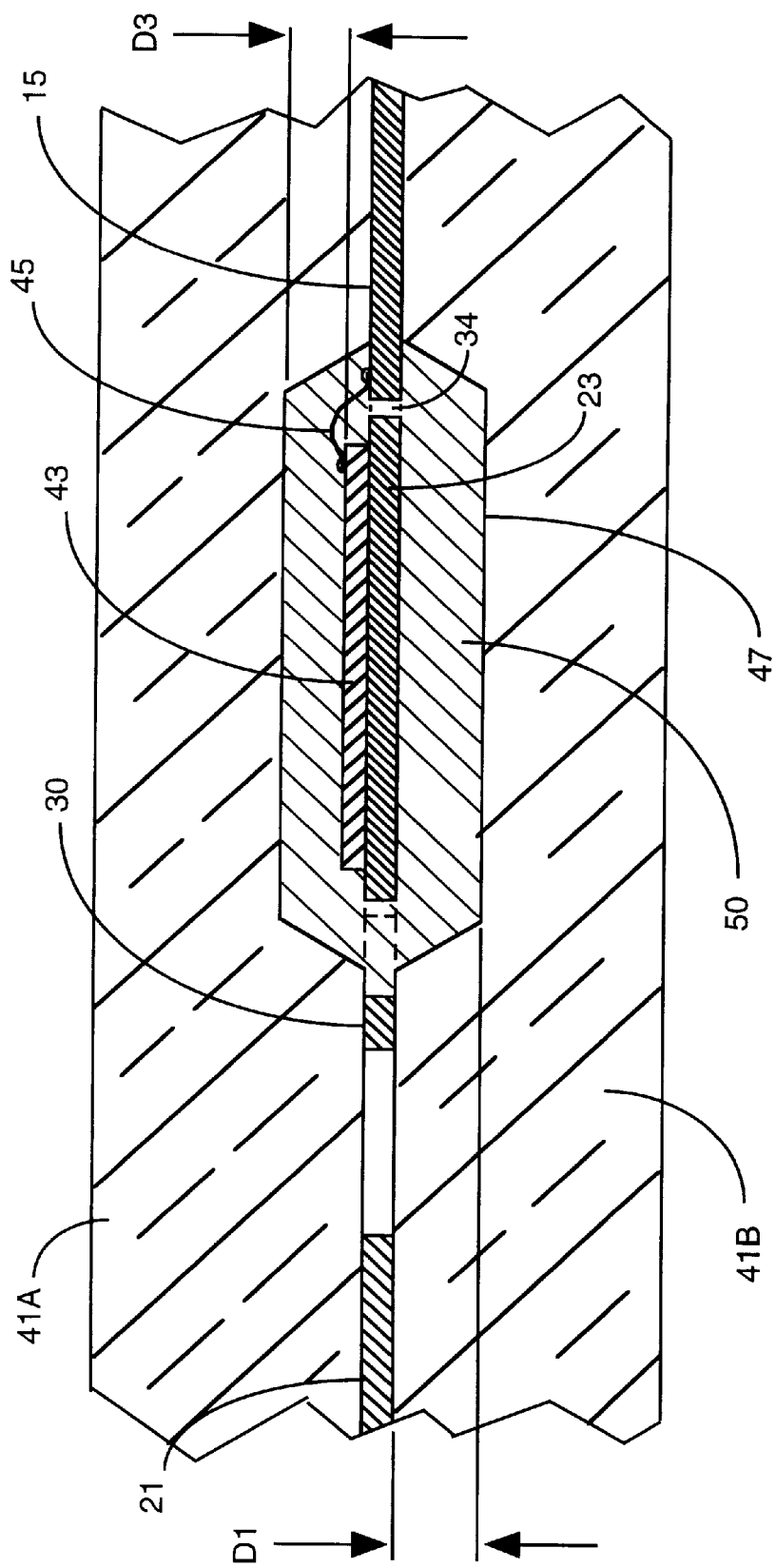
FIG. 3 is a cross-sectional view of a lead frame taken along section line 3—3 in FIG. 2 after IC die encapsulation, with an encapsulation mold in place.

FIG. 3 is a cross-sectional view of a portion of frame 22 taken along section line 3—3 of FIG. 2 after IC die 43 placement and bonding, wire bonding, and encapsulation, with an encapsulation mold in place and filled with polymer 50. IC die 43 is shown attached to die attach pad 23, and wires 45 are bonded between each contact pad on IC die 43 and its corresponding lead. Wires 45 span gap 34 between each contact pad on IC die 43 and its respective conductive lead 15.

After die attach and wire bonding process are completed, lead frame strip 21 is positioned between two opposing mold portions 41A and 41B. Within the body of each of portions 41A and 41B, at each cavity, there is typically one or more passages into a cavity for entry of injected liquid-phase polymer, and one or more passages for bleeding off displaced air. These injection and air bleeding passages are not shown in FIG. 3, but air bleeding passages are typically located at the corners of the molds. Further, air bleeding passages may be in either or both portions of the mold, and may vary in number for molds intended for different lead frames and packages. Location of air bleeding passages is an important characteristic in flow characteristic in mold filling, which is believed to strongly influence the way IC die 43, die-attach pad 23, and other components may move in a molding process.

Mold portions 41A and 41B are positioned and closed, and liquid-phase polymer is injected and flows until it completely fills the volume around IC die 43 and die attach pad 23. When the polymer has solidified, mold portions 41A and 41B are opened and lead frame strip 21, with encapsulated and bonded IC dies, such as die 43, is ready for trimming to produce individual IC packages.

In FIG. 3, dimensions D1 and D3 represent clearances between die attach pad 23 and IC die 43, and adjacent, nearby mold surfaces, which are, in this example, bottom surfaces of cavities of each upper and lower mold portions. These dimensions, which are kept relatively small to minimize material usage as described above, may be as small as 0.010 inch, or sometimes even less Also as described above, there are a number of agents of distortion, such as pre-stressed lead frame material, forces induced by flow of polymer material into the closed mold, and forces due to ever-present gravity. As a result of these forces. IC die, die-attach pad 23, and other components are sometimes moved to contact the inside surface of a cavity in a portion of a mold, such as inside surface 47 of lower mold 41B. When this happens, and polymer material solidifies with IC die 43, die-attach pad 2', or other components thus out of position. A resulting package has an exposed component, and may be rejected.

A problem with the conventional apparatus and method of IC encapsulation, described in FIG. 3, is heat removal. As already explained, high circuit densities and operating speeds cause a microcircuit to consume relatively large amounts of power and to consequently dissipate relatively large amounts of heat. The conventional method shown in FIG. 3 has only conductive leads 15 to remove heat from the IC die via wires 45, along with heat conduction through a plastic mold compound.

As described above in the section entitled "Background of the Invention", lead frames have been altered to replace die attach pads with CVD-produced diamond substrates, wherein the diamond substrates are bonded to the frame leads and serve as new die attach pads. That process is expensive and time consuming.

An assumption made in the conventional diamond substrate solution is that the diamond substrate must be bonded directly to the IC die and to the leads from the package. The present inventors have discovered this assumption is not true, and that, surprisingly, a diamond substrate placed in near thermal proximity to a conventional die attach pad, opposite the IC die, and also in near thermal proximity to a number of the leads from the finished package, provides heat dissipation substantially as efficiently as having the die attach pad removed and replaced by a bonded diamond substrate.

Figure 4:
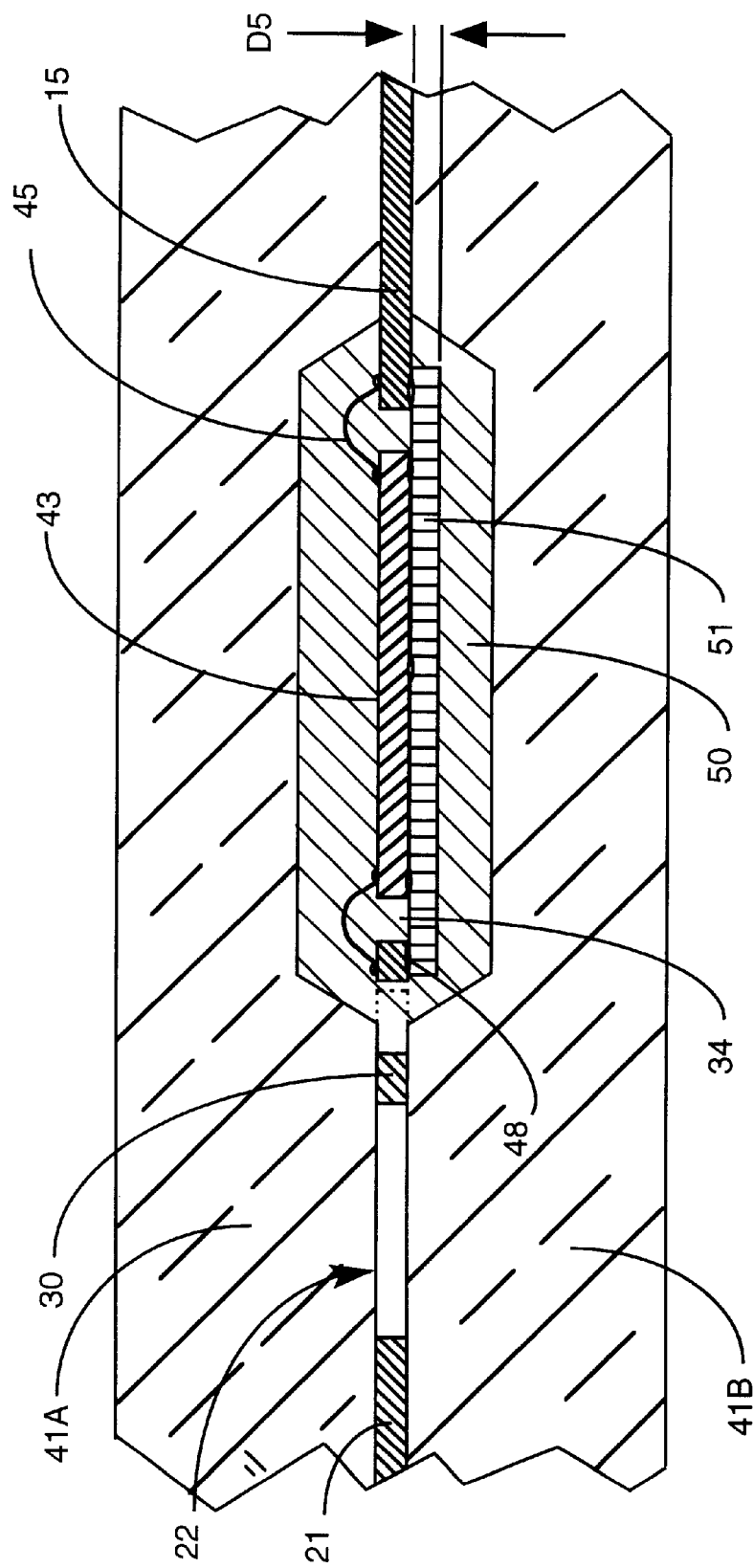
FIG. 4 is a cross section of an IC encapsulation mold set closed on a lead frame, with an IC die and CVD diamond substrate bonded to an altered lead frame according to a process of the prior art.

FIG. 4 is a cross section of a mold set 41A and 41B closed on lead frame 22, similar to the cross section of FIG. 3 with a bonded CVD diamond substrate 51 substituted for the usual die attach pad. This is illustrative of the die attach pad replacement process described above in the section "Background of the Invention". This process, again, is known in the art, and is described in some detail in a sheet entitled "Power Packaging" provided along with this application as part of an information disclosure statement, and labeled Exhibit A. This is a trademarked package called DIAMA-DIP™ by Norton Co. of Northboro, Mass.

IC die 43 is bonded directly to the CVD diamond substrate in this process, with the die attach pad entirely cut away and removed, on the assumption that such intimate contact is necessary to produce the desired result. CVD diamond substrate 51 is bonded with an electrically nonconductive material, such as plastic polymer, epoxy, or any other material deemed suitable by those skilled in the art, to leads 15, and IC die 43 is attached directly to IC die 43 and conductive leads 15.

The apparatus and method of replacing conventional die attach pads in a lead frame, illustrated by FIG. 4, adds several steps to an IC packaging process which can be eliminated. The present inventors have discovered that the assumptions underlying the known method, directing the use of diamond substrates as replacement die attach pads, are incorrect. Actually, the conventional die attach pads may be left in place, so conventional lead frames can be used, and a diamond substrate may be simply placed in close proximity to the die attach pad opposite the IC die, and underlying some of the leads. In this arrangement, which is according to the present invention, heat generated by an IC die in operation is transferred to and through the die attach pad, into the diamond substrate in close proximity to the die attach pad, through the diamond substrate, and finally to leads from the package, the leads in close proximity to the diamond substrate. A CVD diamond substrate, according to a method of the present invention, can be simply dropped into the lower cavity of a transfer mold, and held in place by, for example, alignment pins during the encapsulation process.

Figure 5A:
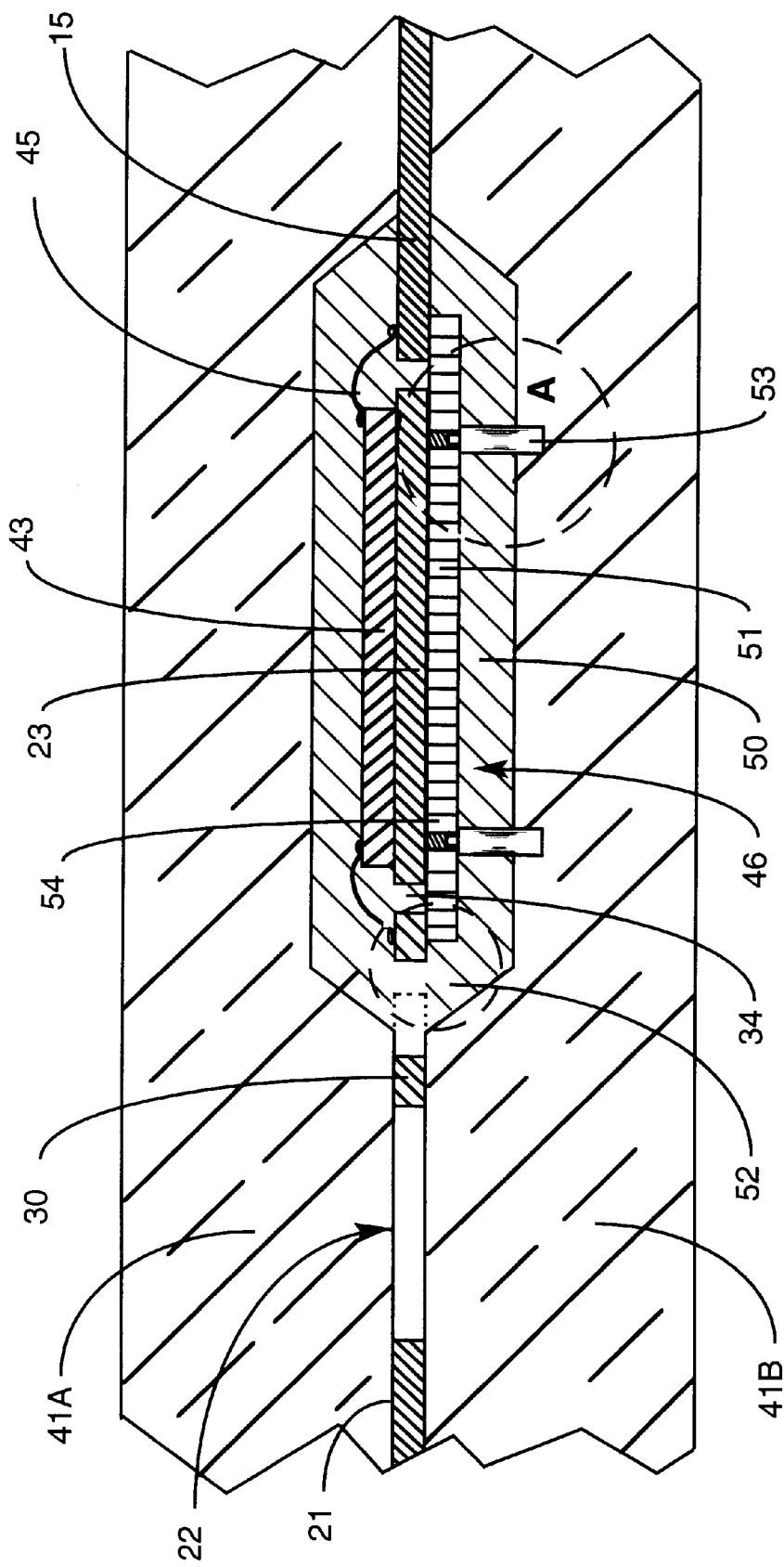
FIG. 5A is a cross section of an IC encapsulation mold set closed on a conventional lead frame, with an IC die and a diamond substrate included according to a preferred embodiment of the present invention.

FIG. 5A is a cross section of a mold set 41A and 41B closed on lead frame 22, similar to the cross section of FIG. 3, but according to a preferred embodiment of the present invention, wherein the only step added to the conventional process of IC packaging without a CVD diamond substrate, is to place a diamond substrate 51 into lower mold cavities before the lead frame is positioned and the mold portions are closed prior to injection.

In the embodiment shown by FIG. 5A a diamond substrate 51 is placed in lower cavity 46 of mold portion 41B onto support and alignment pins 53. In this embodiment, pins 53 are pressed into holes provided for the purpose in bottom surface 47 of cavity 46 as shown. It will be apparent to those with skill in the art that the pins may be provided in the cavity in a number of ways, such as by being glued, screwed, brazed, welded, and so on. In other cavities (not shown) of mold portion 41B, pins are provided in the same manner as shown for cavity 46.

In this embodiment some pins (at least two) pins 53 are shouldered at the end that extends from surface 47, so holes in substrate 51 may fit over the extended portion of the pins to provide horizontal alignment. In the embodiment shown by FIG. 5A holes 54 are provided to mate with pins 53, such that substrates 51 are optimally positioned to be adjacent lead frame 22 at the bottom surface of the die attach pad and also adjacent to at least a substantial number of leads (note area 52). It will be apparent to those with skill in the art that there are a number of ways pins and holes or depressions may be fashioned to accomplish this purpose. The arrangement shown with shouldered pins is convenient.

The positions in surface 47 for alignment pins 53 are exemplary, as those skilled in the art may select appropriate positions, depending on engineering criteria such as structural analysis, application, and packaging As method.

After diamond substrates are placed on pins 53, the rest of an encapsulation process relative to FIG. 5A in this embodiment of the invention is the same as already described for FIG. 3. That is, a lead frame is placed in position with IC dies attached to the die attach pads and wire bonding accomplished, then the mold portions are closed and polymer is injected. Support pins 53 urge diamond substrate 51 into close physical, and thus thermal, proximity to die attach pad 23 and conductive leads 15.

Close thermal proximity between diamond substrate 51 and die attach pad 23 allows heat to be conducted efficiently from IC die 43 through die attach pad 23 and into diamond substrate 51 when the integrated circuitry of IC die 43 later is in operation. Furthermore, close thermal proximity between CVD diamond substrate 51 and conductive leads 15 allows heat conducted through diamond substrate 51 to be transferred to leads 15 and thence to outside the package, and typically into conductive traces of relatively large mass on a printed circuit board.

Figure 5B:
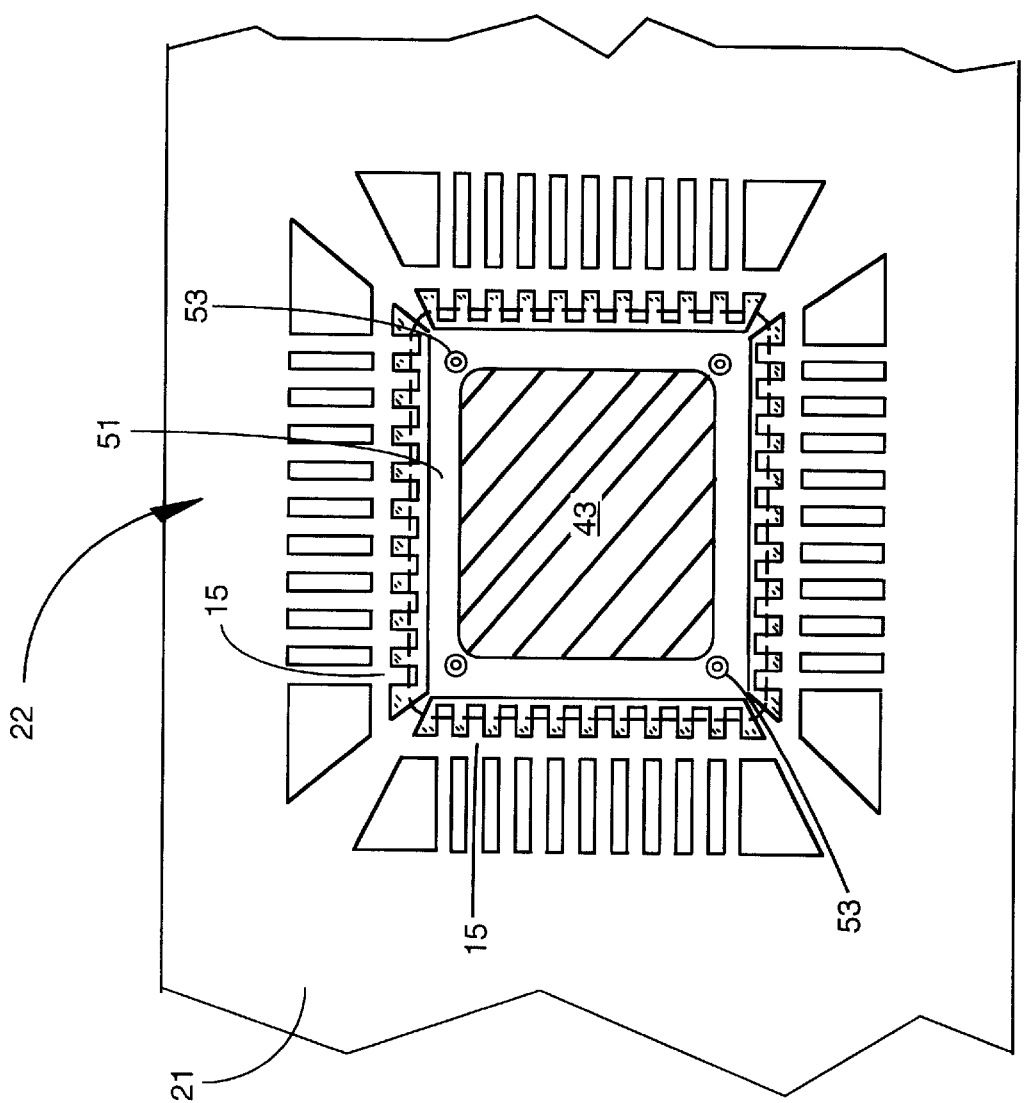
FIG. 5B is an idealized plan view of the lead frame with an IC die and a diamond substrate shown in FIG. 5A.

FIG. 5B is an idealized plan view of one frame 22 of a typical lead frame strip 21 in the embodiment of the invention described with reference to FIG. 5A. Frame 22 is part of a typical lead frame strip 21. and contact pads on IC die 43 are bonded to conductive leads 15 by connecting wires 45. Diamond substrate 51 is held in close thermal proximity to die-attach pad 23 by alignment pins 53. Wires 45 are not shown so the relationship between diamond substrate 51 and other components may be clearly seen. As in FIG. 5A, pin 53 positions in FIG. 5B are illustrative only, and could be at many positions as determined by those skilled in the art, as long as they hold diamond substrate 51 in place.

Figure 5C:
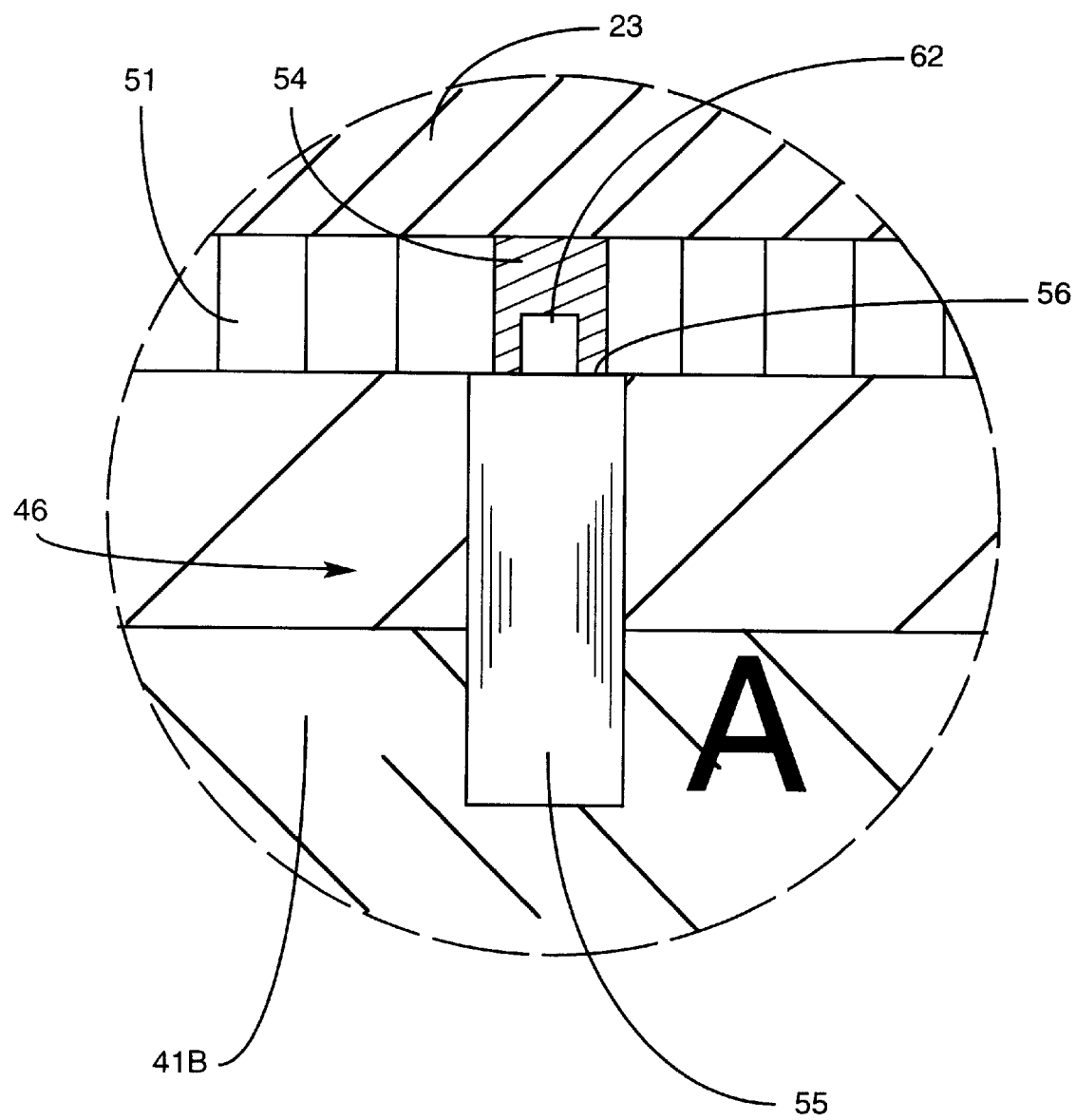
FIG. 5C is an enlarged view of a portion of FIG. 5A, showing an alignment pin and its relationship with other elements in the embodiment of the present invention also illustrated by FIGS. 5A and 5B.

FIG. 5C is an enlarged view of area A in FIG. 5A, showing one alignment pin 53, a portion of diamond substrate 51, die attach pad 23, and part of lower mold portion 41B. As described above, hole 54 in diamond substrate 51 is such that alignment pins 53 may engage, support, and position the diamond substrate, which rests on a shoulder 56. These holes may be provided in the diamond substrate either as a step in the process of deposition, or by machining. Portion 62 of pin 53 is shorter than the thickness of the diamond substrate, and serves to position the diamond substrate laterally, that is, horizontally, while still allowing some leeway in positioning.

Alignment pins 53 could be made from any of a variety of suitable materials, such as stainless steel, aluminum, copper, tool steel, or any material determined suitable by those skilled in the art.

It will be apparent to those with skill in the art that pins 53 may be shaped, positioned and otherwise provided in a variety of equivalent ways, and the issue is not one of these details, but the ability of the pins to support and properly position the diamond substrate.

Figure 6A:
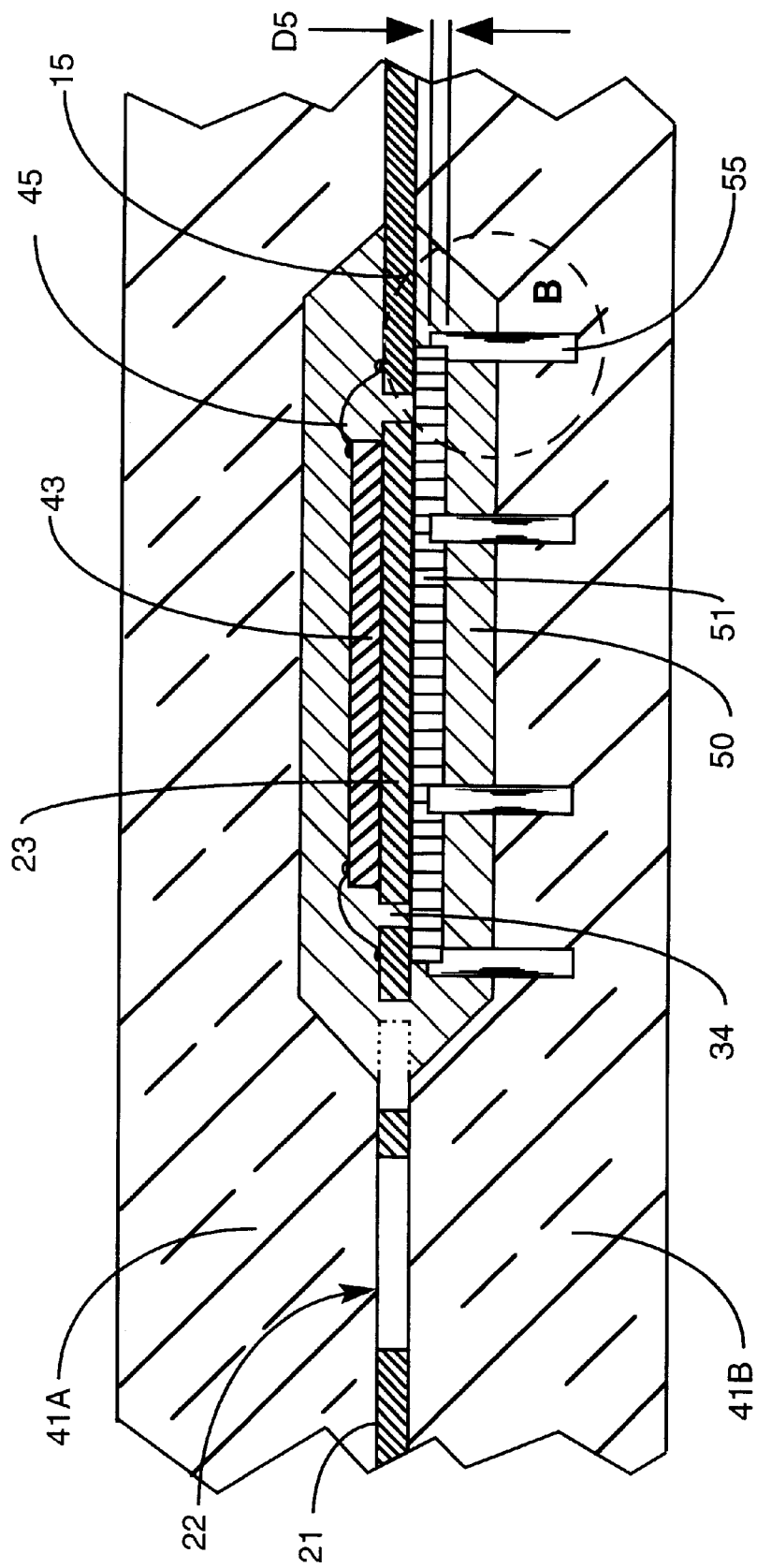
FIG. 6A is a cross section of an IC encapsulation mold set closed on a lead frame, with an IC die and diamond substrate according to an alternative embodiment of the present invention.

FIG. 6A is a cross section of a mold set 41A and 41B closed on lead frame 22 according to an alternative embodiment of the present invention, wherein alignment pins 55 each have a stepped shoulder for supporting and positioning diamond substrate 51 in place. The edges of diamond substrate 51 rest on the stepped shoulders of alignment pins 55. As in the embodiment shown in FIG. 5A, the embodiment of FIG. 6A adds only one step to the conventional method, that is, to place shaped diamond substrates 51 into lower mold cavities before closing the mold.

In the embodiment of FIG. 6A diamond substrate 51 is placed with its edges resting on the shoulders of alignment pins 55. The shoulder height D5 of alignment pins 55 is less than the thickness of substrate 51, so pins 55 do not protrude above diamond substrate 51. Alignment pins 55 may be fixed into the bottom of the lower cavity in a variety of ways, as described above for the pins in FIG. 5A. Positions shown for alignment pins in FIG. 6A are exemplary only, as those skilled in the art may select appropriate positions other than those shown in FIG. 6A.

The rest of an encapsulation process for the embodiment of FIG. 6A is the same as described above relative to FIG. 3. With molds 41A and 41B closed, pins 55 support substrate 51 and urge the substrate against die attach pad 23 and conductive leads 15. Note that die-attach pad 23 is not removed, and bonding of the substrate to the leads is not required. Close thermal proximity between CVD diamond substrate 51 and die attach pad 23 allows conduction of heat from IC die 43 through die attach pad 23 to diamond substrate 51. Furthermore, close thermal proximity between diamond substrate 51 and conductive leads 15 allows conduction of heat generated by IC die 23 into the leads.

Figure 6B:
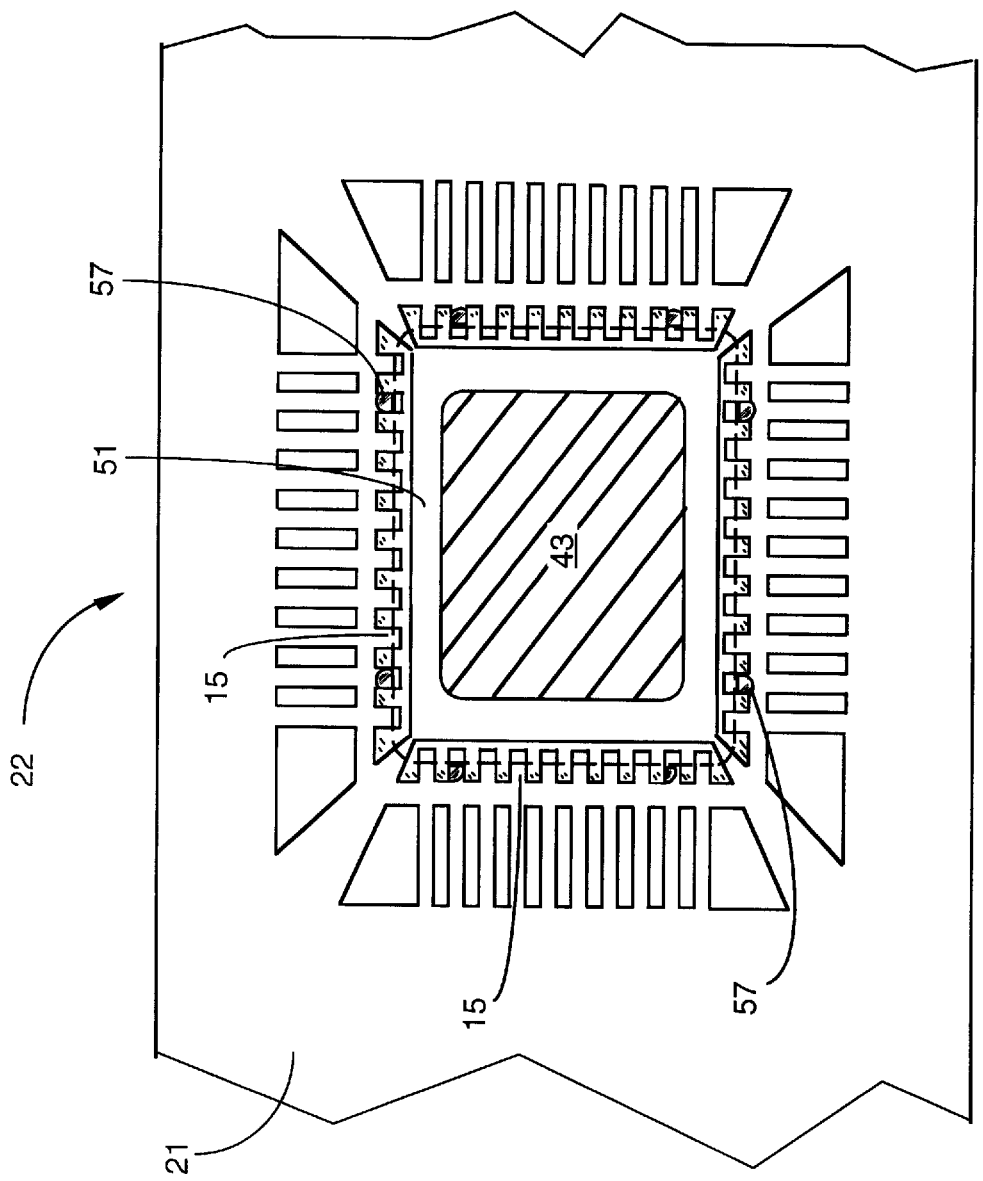
FIG. 6B is an idealized plan view of a lead frame with an IC die and diamond substrate in the embodiment described by FIG. 6A.

FIG. 6B is an idealized plan view of the arrangement of FIG. 6A to illustrate the positioning of the support pins and the diamond substrate. As in FIG. 6A, the positions of the support and alignment pins are exemplary only and could be rearranged.

Figure 6C:
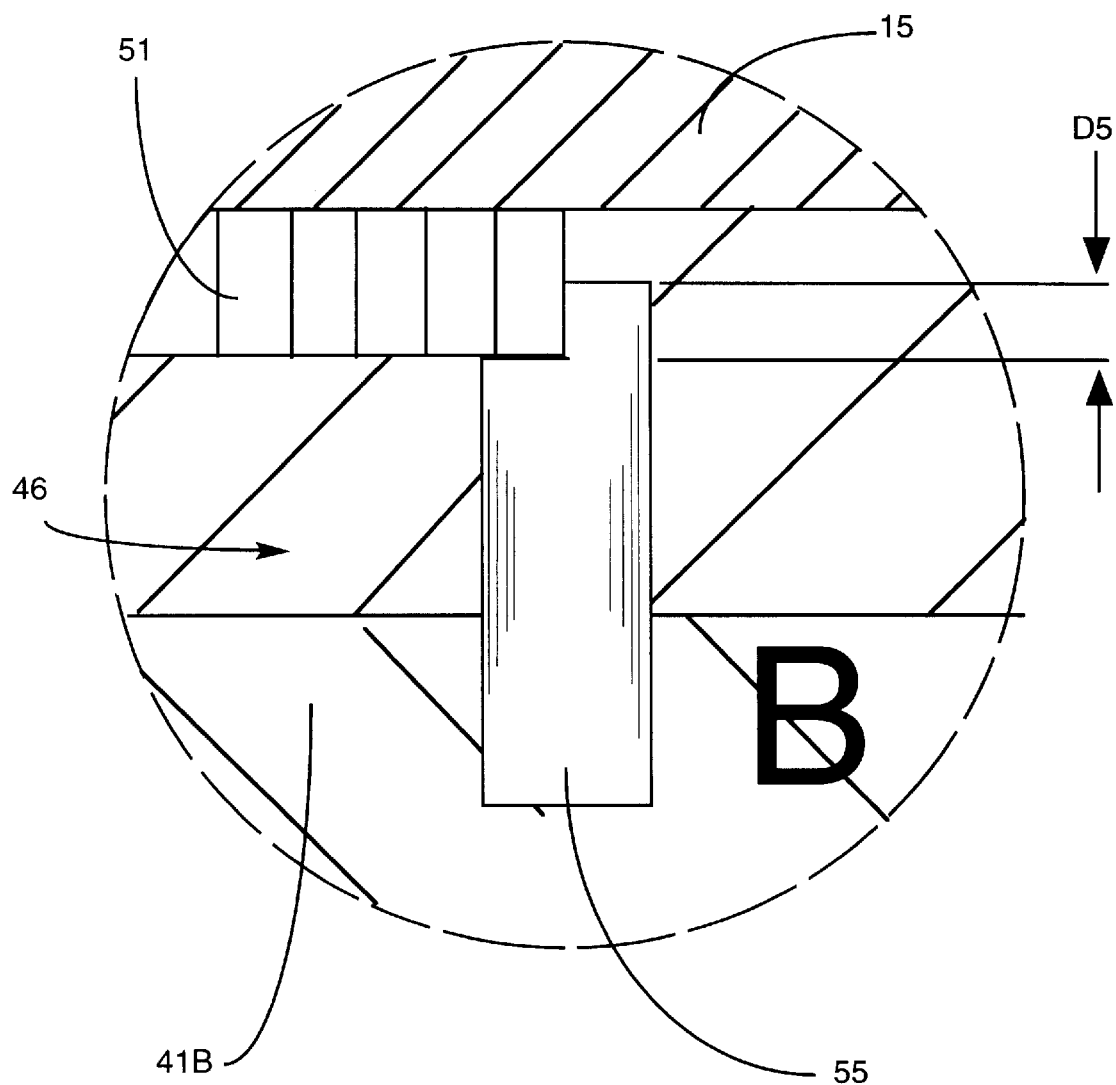
FIG. 6C is an enlarged view of a portion of FIG. 6A showing an alignment pin shouldered end and its relationship with other elements in an IC encapsulation mold.

FIG. 6C is an enlarged view of a support pin 55 from FIG. 6A, showing support and positioning of substrate 51. As described above, the shoulder height for pins 55 is less than the thickness of diamond substrate 51, so no portion of the support pin will protrude above diamond substrate 51. Support and alignment pins 55 could be made from any of a variety of suitable material, such as stainless steel.

FIG. 7A is a cross section view of yet another alternative embodiment of the present invention. In this embodiment, substrate 51 rests on the bottom surface 47 of cavities in mold portion 41B. The substrate in this embodiment is positioned horizontally by alignment pins 57. As in the embodiment shown in FIG. 5A, the alternative embodiment as shown in FIG. 7A adds only one step to the conventional encapsulation process, that is, to place shaped diamond substrate 51 in each lower mold cavity before closing the mold to encapsulate.

In the alternative embodiment shown in FIG. 7A, diamond substrate 51 is placed in cavity 46 in mold portion 41B, and is supported by surface 47, rather than by support pins. Alignment pins 57 are positioned to restrain substrate 51 horizontally, to lie under die attach pad 23 and also to overlap leads 15. Pins 57 are tapered and rounded in the portion extending into the mold cavity, so voids left in a molded package by the pins are minimized. Extension dimension D7 of these pins is less than the thickness of the diamond substrate to avoid interference with die attach pad 23.

In the embodiment shown by FIG. 7A, the side of substrate 51 that rests on the bottom of the mold cavity will be exposed to some extent in a finished package, but this has not been found to be detrimental. The thickness of substrate 51 in this embodiment is selected to be equal to or slightly greater than the nominal clearance between the bottom of the die attach pad and surface 47 of the cavity in mold portion 41B, which allows the substrate to be molded in place with close physical and thermal proximity to the die attach pad.

After placement of substrate 51, the rest of an encapsulation process in this alternative embodiment is the same as already described for FIG. 3.

Figure 7B:
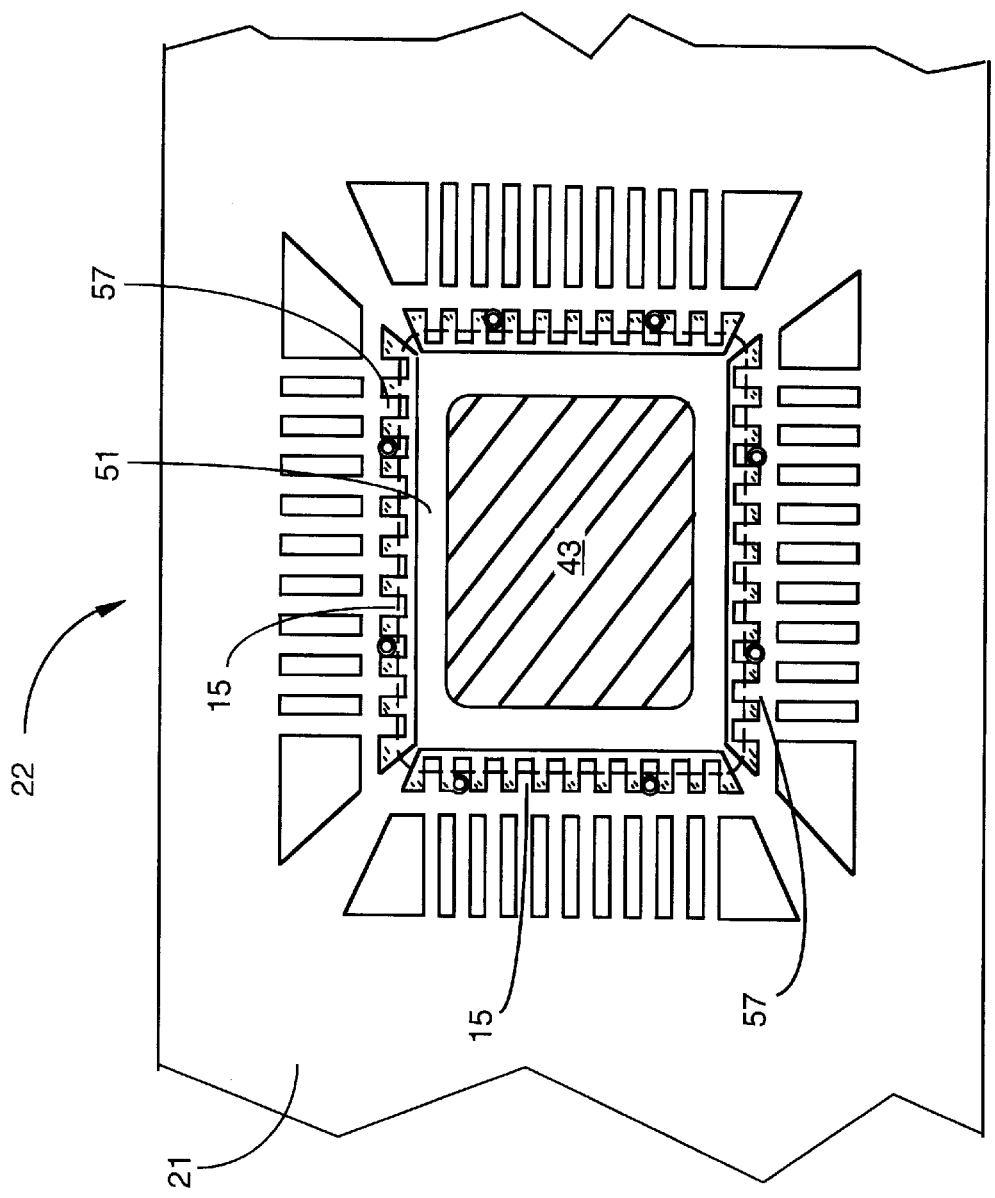
FIG. 7B is an idealized plan view of the embodiment of FIG. 7A.

FIG. 7B is an idealized plan view of the alternative embodiment shown in FIG. 7A, showing one frame 22 of a typical lead frame strip 21 after IC die 43 is attached to the lead frames with connecting wires 45, and diamond substrate 51 is held firmly in horizontal position by alignment pins 57. Alignment pins 57 positions are shown around the outer periphery of diamond substrate 51, so the diamond substrate is held horizontally to underlie leads 15, to provide a thermal bridge from the die attach pad to the leads.

The positions of pins 57 shown in FIG. 7B are convenient, and other positions could be provided by those with skill ion the art to accomplish the same purpose.

Figure 7C:
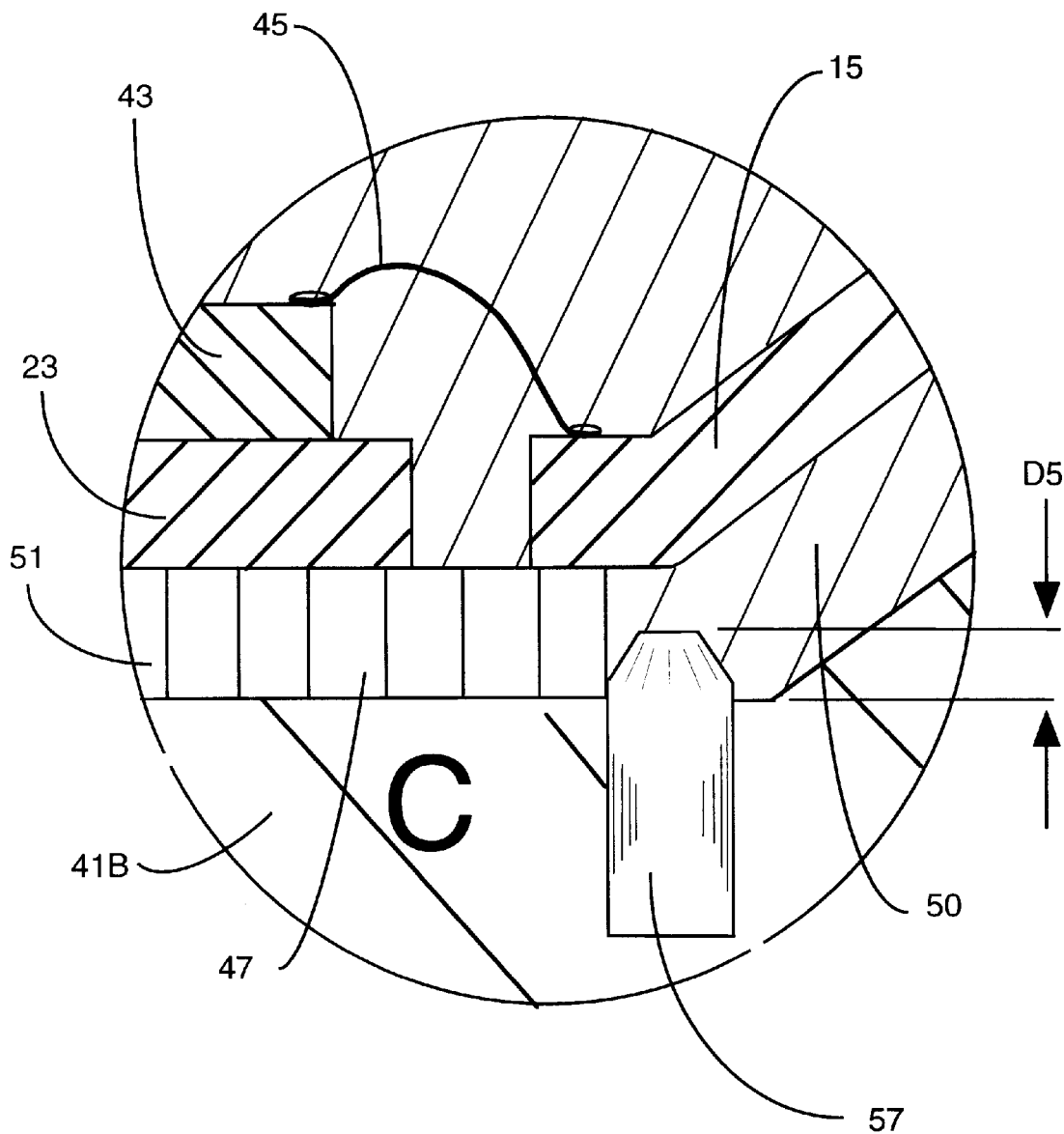
FIG. 7C is an enlarged view of a portion of FIG. 7A, showing an alignment pin and its relationship with other elements in the encapsulation mold.

FIG. 7C is an enlarged view C of the portion of FIG. 7A in broken circle C, showing one pin 57 engaged in bottom surface 47 of cavity 46 of mold portion 41B, and a portion of diamond substrate 51, die attach pad 23, and IC die 43. As described above, height D7 is provided so the pin does not protrude beyond the thickness of the diamond substrate.

Figure 8A:
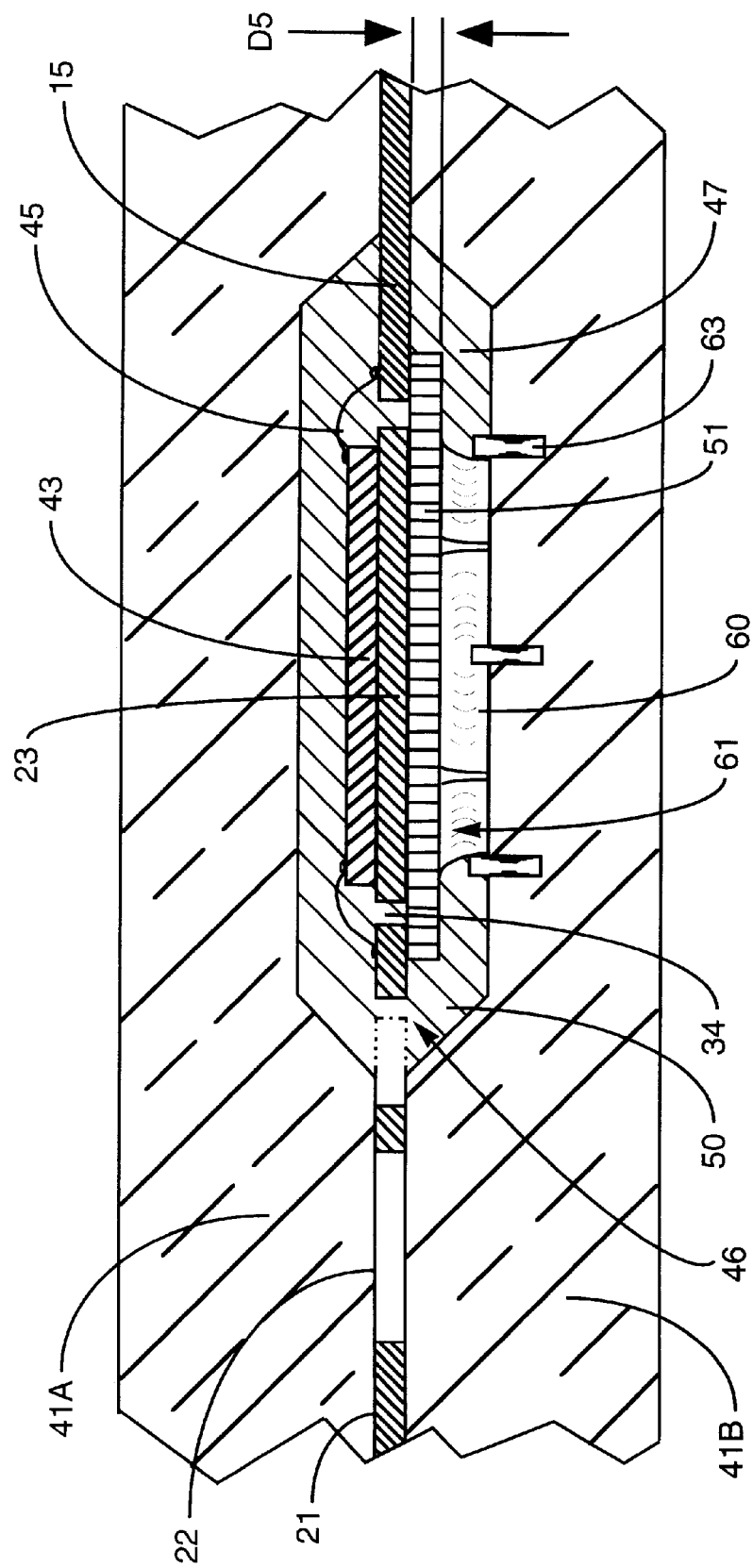
FIG. 8A is a cross section of an IC encapsulation mold set closed on a lead frame, with an IC die and diamond substrate according to yet another alternative embodiment of the invention.

FIG. 8A is a cross section of mold set 41A and 41B closed on lead frame 22, similar to the cross section of FIG. 3, but according to yet another alternative embodiment of the present invention. In this alternative, a diamond substrate 51 is bonded to a metal slug 60 to make a combination heat stug 61 in a process independent of the encapsulation process. The combination heat slug is placed in cavity 46 before the lead frame is placed and the mold is closed.

In some cases the metal slug has support appendages for standing off from the bottom surface of the lower cavity, and in some cases there are no such appendages.

Combination heat slug 61 is positioned in mold cavity 46 by pins 63 in the same manner as described above for pins 57 in FIG. 7A. As with other embodiments of the present invention described herein, the embodiment of FIG. 8A adds only the step of placing the combination heat slug in the cavity in the mold portion to the conventional process.

Diamond substrate 51 bonded with heat slug 60 is placed in cavity 46 in mold portion 41B within a reunion bounded by pins 63, and pins 63 protrude only a short distance into cavity 46, so they do not interfere with other elements and leave only a minimum impression in a finished package.

Pins 63 may be fixed in bottom surface 47 of cavity 46 in a number of ways, as have been described above relative to other embodiments of the present invention. Moreover, the positions shown are exemplary, as the pin positions are dictated to some extent by the shape of heat slug 61. After placing combination heat slug 61 in the mold cavity, the rest of the encapsulation process in this alternative embodiment is the same as already described above for other embodiments of the invention.

Figure 8B:
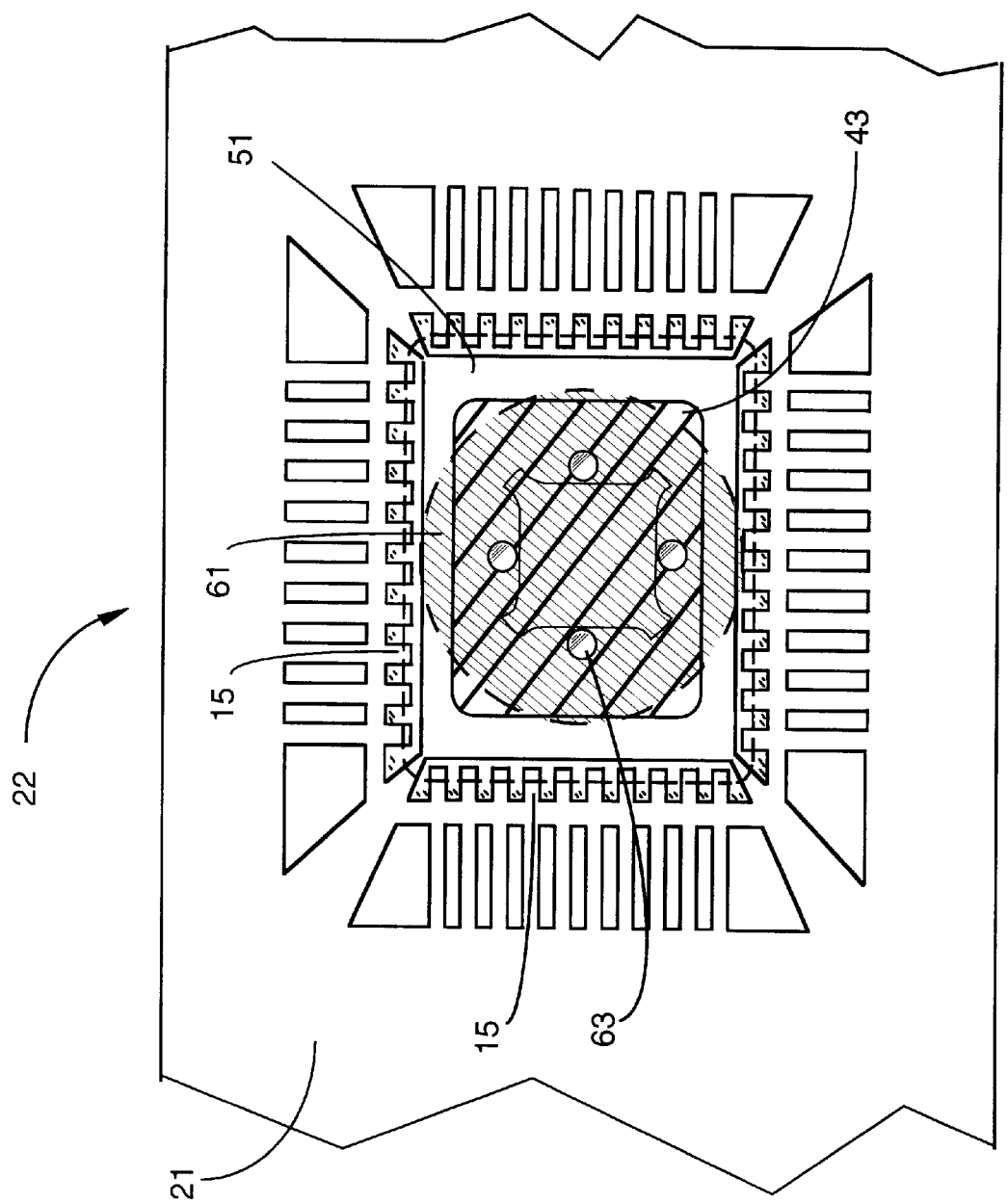
FIG. 8B is an idealized plan view of the embodiment shown in FIG. 8A.

FIG. 8B is an idealized plan view of the embodiment shown in FIG. 8A, showing one frame 22 of lead frame strip 21 after IC die 43 is attached to the lead frames with connecting wires 45, and combination heat slug 61 is placed in cavity 46, positioned by pins 63. As in other embodiments described above, the pin positions are convenient and exemplary, as other positions may be used, depending partly on the design of the metal portion of the combination heat slug.

In the embodiment of FIGS. 8A and 8B alignment pins are shown for positioning the support portion of the combination heat slug. In some embodiments alignment pins are not needed as the support position of the combination heat slug with a diamond substrate may be shaped to part of the bottom surface of the cavity in the mold portion in which it is placed, and the shape of the cavity positions the support portion of the combination heat slug.

Figure 8C:
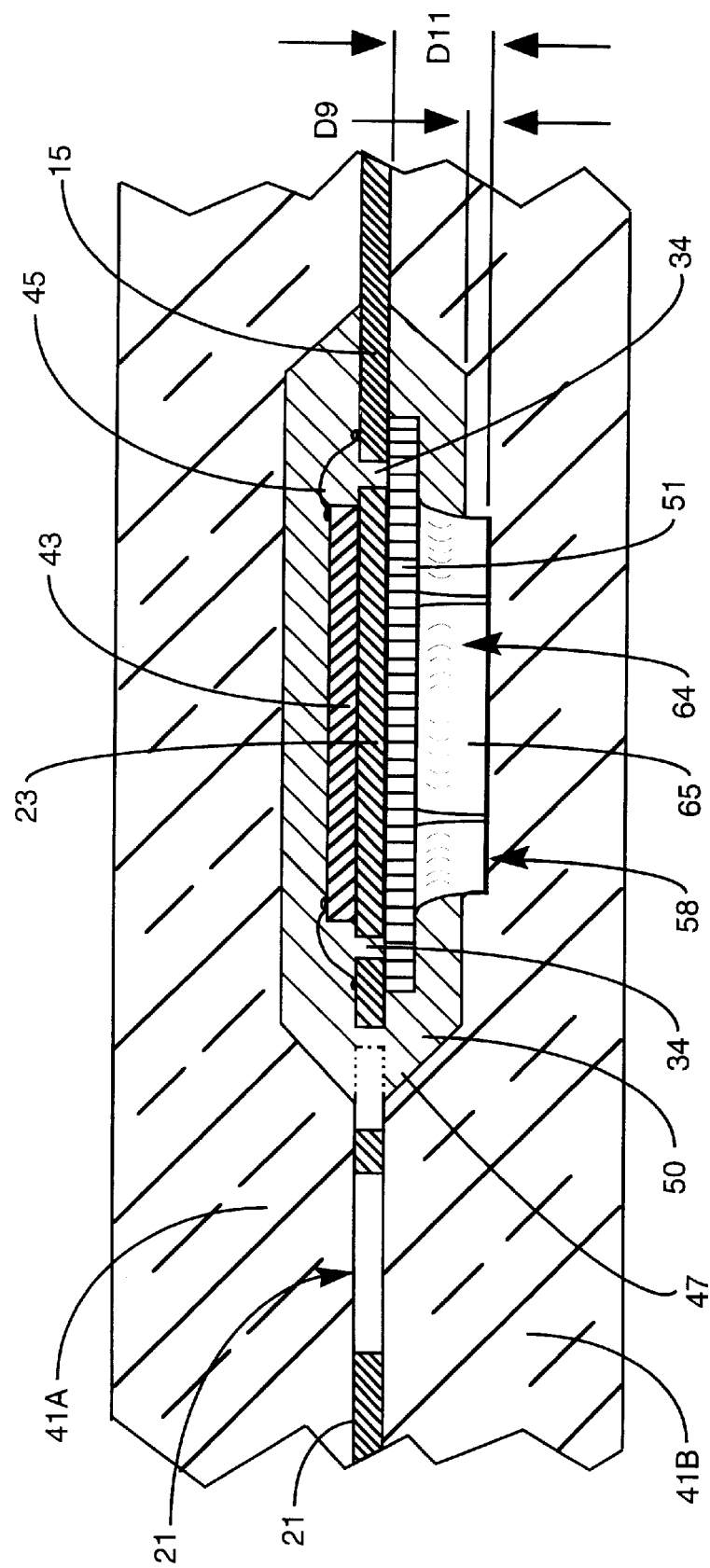
FIG. 8C is a cross section of an IC encapsulation mold set closed on a lead frame according to vet another embodiment of the present invention.

FIG. 8C is a cross section of mold set 41A and 41B closed on lead frame 22, similar to the cross sections illustrating embodiments above, but according to still another alternative embodiment of the present invention. In this embodiment a combination heat slug is used, as described for the embodiment of FIG. 8A, but alignment pins are not used. Instead of alignment pins, a recession 58 of depth D9 is formed in the bottom cavity of lower mold 41B, shaped to receive combination heat slug 64, which is provided with a height D11 equal to D9 plus the clearance between cavity bottom surface 47 and the underside of die attach pad 23 of lead frame 21.

An advantage of the embodiment of FIG. 8C is that a metal slug protrudes from a finished package, and provides an extra dimension in heat conductivity. The diamond substrate still conducts heat to the leads, and heat may also be conducted via metal portion 65 of combination slug 64 to outside at the bottom of a finished package. In some cases, this metal protrusion may be soldered or otherwise affixed to heat management elements on a PCB or other apparatus upon which packaged ICs may be mounted.

Figure 9:
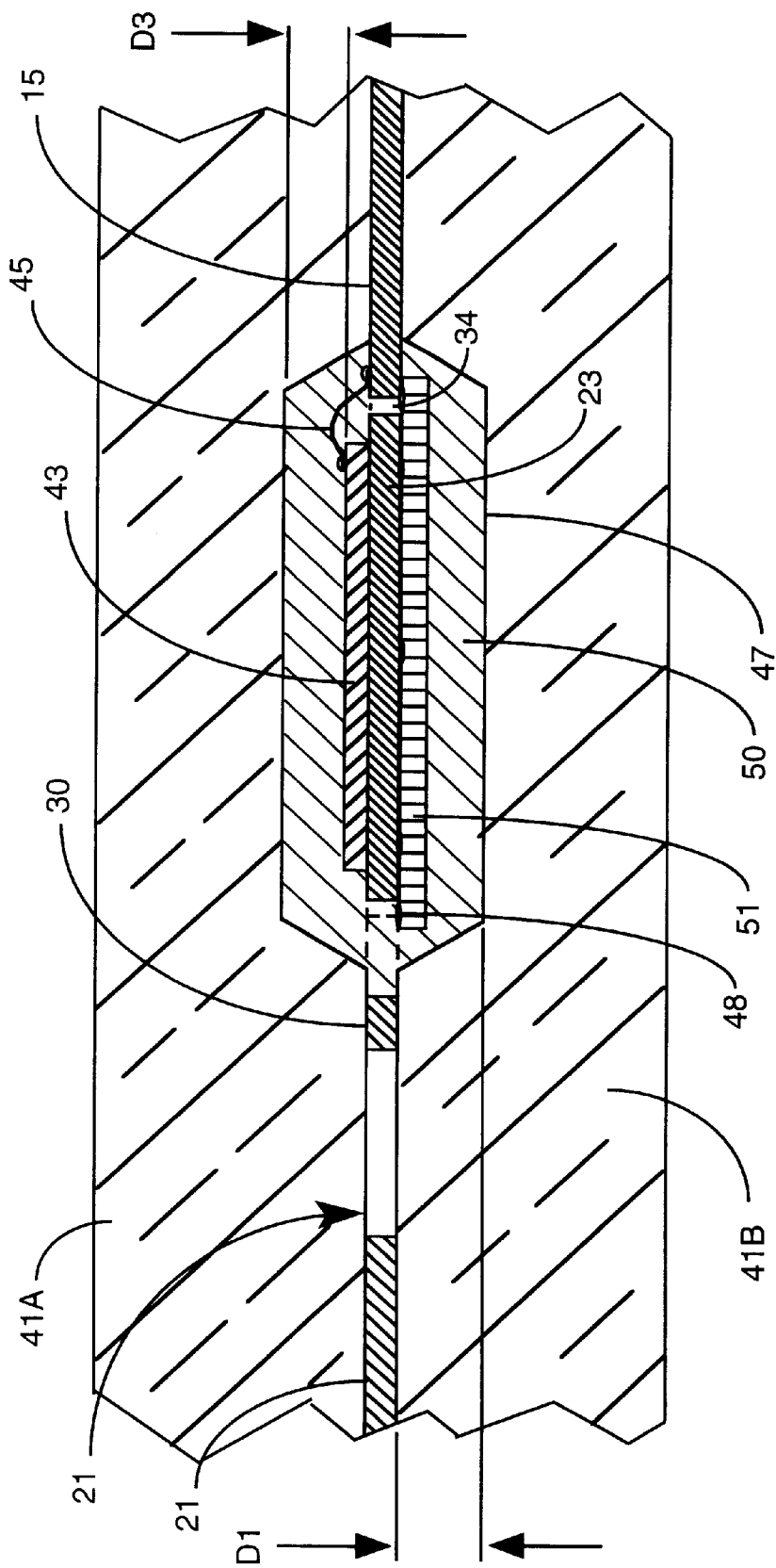
FIG. 9 is a cross section of an IC encapsulation mold set closed on a lead frame, with an IC die and diamond substrate according to vet another alternative embodiment of the invention.

FIG. 9 is a cross section of mold set 41A and 41B closed on lead frame 22, similar to the cross sections illustrating embodiments above, but according to still another alternative embodiment of the present invention. In this embodiment, substrate 51 is bonded directly to one or both of dia-attach pad 23 and conductive leads 15 in a process outside and before the encapsulation process. In this embodiment die-attach pad 23 is not removed, as is done in the prior art method described above, eliminating a time-consuming and costly step.

After bonding substrate 51 to die attach pad 23, to leads 15, or to both, lead frame stip 21 is positioned between two opposing mold portions 41A and 41B, afterwhich the rest of an encapsulation process in the embodiment of FIG. 9 is the same as described above relative to FIG. 3. The step of bonding the substrate to one or the other, or both, of the die attach pad and the leads serves to position the diamond substrate in the encapsulation process, just as pins and so forth do in other embodiments of the present invention described above.

It will be apparent to those with skill in art that there are a variety of alterations that might be made in details of embodiments of the invention described above without departing from the spirit and scope of the invention. For example, there are many different package designs in the art, and the nominal clearance between a die attach pad or an attached die and the nearby surface of a mold cavity may be different for many of these designs. The length of a support element, such as alignment pins or heat slug, and its relationship to a diamond substrate and a die-attach pad, would be matched substantially to this nominal dimension for each design.

In another example, the number of alignment pins and heat slugs were described above as convenient to each case, but more or fewer alignment pins or more than one heat slug could be used in many cases. There are many possibilities for placement and spacing of alignment pins and heat slugs. Some representative examples have been provided in this disclosure. There are also many shapes and forms an alignment pin or heat slug might take from that described herein as a preferred embodiment and alternative embodiments.

There are similarly many other alterations that might be made without departing from the spirit and scope of the invention.

An important feature of the present invention is that the diamond substrate underlie the die attach pad of a conventional lead frame, and also underlie a significant proportion of the ends of external leads within the encapsulation volume of packages. Support pins and metal portions of heat slugs in various embodiments are provided with dimensions that cause a supported diamond substrate to contact die attach pads and the undersides of leads before polymer is injected in the molding operation. The die attach pads and heat slugs are not all on precisely the same level, however, in any lead frame, and it is known that, while there may be several points of actual contact, in other cases the diamond is only very close to a portion of a die attach pad or a lead. This separation is thought to be within about 0.005 inches in all cases. Moreover, in sectioning some packages molded according to the invention, the separations at heat transfer points have been found to be within this dimension (0.005 inches).

In temperature and heat transfer tests of packages formed according to embodiments of the present invention, comparing with similar packages manufactured according to the prior art solution wherein die attach pads are removed and CVD diamond substrates are glued or otherwise bonded to leads from the package in place of die attach pads after die attach pads are removed, the surprising result is that the packages manufactured according to the present invention perform as well as those manufactured with die attach pads removed and replaced with diamond substrates.

Even in cases where flow anomalies and other characteristics might cause some separations to be more than about 0.005 inches, the invention may still accomplish the purpose for which it is intended. Moreover, it is not required that every lead be involved, but the more leads that can be brought into active heat transfer, the better. In some embodiments a few leads, such as near corners of a package, may not be involved.

What is claimed is:

1. A method for forming a plastic encapsulated IC package, comprising steps of:

(a) attaching an IC die to a die attach pad of a lead frame;

(b) bonding wires from contact pads on the IC die to leads of the lead frame;

(c) opening an encapsulation mold;

(d) placing a diamond substrate in a lower cavity of the encapsulation mold on support pins engaged in a bottom surface of the lower cavity of the encapsulation mold through openings for location in the diamond substrate, such that the diamond substrate underlies the die attach pad and the portion of the leads of the lead frame in near proximity;

(e) placing the lead frame in the encapsulation mold, such that die attach pads and a portion of leads of the lead frame at each frame overlie the diamond substrate in near proximity;

(f) closing the encapsulation mold; and (g) injecting plastic encapsulation material.

2. The method of claim 1 wherein the lower cavity has a bottom surface, and, in step (d), the diamond substrate is placed on the bottom surface of the lower cavity within a boundary described by pins engaged in the bottom surface, such that the diamond substrate underlies the die attach pad and the portion of the leads of the lead frame in near proximity.

3. The method of claim 1 wherein the lower cavity has a bottom surface and the diamond substrate is a part of a combination heat slug having the diamond substrate bonded to a metal slug, and, in step (d), the combination heat slug is placed on the bottom surface, such that the diamond substrate underlies the die attach pad and the portion of the leads of the lead frame in near proximity.

4. The method of claim 3 wherein the metal slug has appendages for supporting the combination heat slug off the bottom surface of the lower cavity.

5. The method of claim 3 wherein the metal slug has a planar bottom surface, and the planar bottom surface of the metal slug is placed on the bottom surface of the lower cavity.

6. The method of claim 3 wherein the bottom surface of the lower cavity has a recession matching the shape of the metal slug, and the metal slug is engaged in the recession in step (d).

* * * * *